(12) United States Patent
Seo

(10) Patent No.: US 10,680,635 B2
(45) Date of Patent: Jun. 9, 2020

(54) COMPARATOR AND AD CONVERTER

(71) Applicant: SOCIONEXT INC., Yokohama-shi, Kanagawa (JP)

(72) Inventor: Yuji Seo, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/399,494

(22) Filed: Apr. 30, 2019

(65) Prior Publication Data

US 2019/0386672 A1     Dec. 19, 2019

(30) Foreign Application Priority Data

Jun. 18, 2018   (JP) .................................. 2018-115266

(51) Int. Cl.
*H03M 1/46*      (2006.01)
*H03K 5/24*      (2006.01)

(52) U.S. Cl.
CPC .......... *H03M 1/466* (2013.01); *H03K 5/2481* (2013.01)

(58) Field of Classification Search
CPC .............................. H03M 1/466; H03K 5/2481
USPC .................................................. 341/150–165
See application file for complete search history.

(56) References Cited

U.S. PATENT DOCUMENTS

| 7,701,256 B2 * | 4/2010 | Hurrell | H03F 3/45188 |
| | | | 327/336 |
| 10,014,907 B2 * | 7/2018 | Choi | H04B 3/46 |
| 10,505,519 B1 * | 12/2019 | Chen | H03K 3/037 |
| 2010/0141499 A1 | 6/2010 | Mathe | |
| 2012/0319880 A1 | 12/2012 | Matsumoto et al. | |

FOREIGN PATENT DOCUMENTS

| JP | 2010-212773 A | 9/2010 |
| JP | 2011-188240 A | 9/2011 |
| JP | 2012-511284 A | 5/2012 |

\* cited by examiner

*Primary Examiner* — Lam T Mai
(74) *Attorney, Agent, or Firm* — Arent Fox LLP

(57) ABSTRACT

A comparator includes a first circuit including first, second, and third transistors, and a second circuit. One of the first transistor and the second transistor in the first circuit is an input transistor to which an input analog voltage is applied. The third transistor is configured to short-circuit a drain and a source of each of the first transistor and the second transistor during a period when the input analog voltage is applied. The second circuit is configured to output a signal indicating a relationship between magnitude of a first output analog voltage and magnitude of a second output analog voltage, the first output analog voltage and the second output analog voltage being output from

9 Claims, 13 Drawing Sheets

RELATIONSHIP BETWEEN Ccom AND INPUT VOLTAGE

RELATIONSHIP BETWEEN Ccom DIFFERENCE AND INPUT VOLTAGE DIFFERENCE

COMPARATOR AND AD CONVERTER

CROSS-REFERENCE TO RELATED APPLICATION

This patent application is based on and claims priority to Japanese Patent Application No. 2018-115266 filed on Jun. 18, 2018, the entire contents of which are incorporated herein by reference.

BACKGROUND OF THE INVENTION

1. Field of the Invention

The present invention relates to a comparator and an analog-to-digital (AD) converter.

2. Description of the Related Art

Conventionally, a successive approximation AD converter has been known as one type of AC converter. In the successive approximation AD converter, for example, an analog voltage is converted to a digital value in the following manner: First, first analog voltage and second analog voltage are sampled to charge first and second capacitive digital-to-analog converters (DA converters). Next, by comparing a voltage of a capacitor of the first capacitive DA converter with a voltage of a capacitor of the second capacitive DA converter, a difference of the analog voltages is converted to a digital value.

Each of the sampled voltages is given by electric charge charged in the capacitor of the corresponding capacitive DA converter, and electric charge charged in a gate capacitor of a corresponding transistor of transistors which are connected to top plates of the capacitors and which form a differential pair of an input stage of a comparator.

A gate capacitance of each of the transistors forming the differential pair varies depending on gate-source voltage drop of each of the transistors. In a case in which there is a difference between both analog voltages input to the differential pair, the gate-source voltage drop differs between the transistors. Thus, the gate capacitance also varies depending on the difference between both analog voltages input to the differential pair. Especially, when the difference between both analog voltages input to the differential pair is large, a difference of the gate capacitance of each of the transistors becomes larger.

In this case, error occurs in the sampled analog voltages, and as a result, error may occur in a converted digital signal.

The present disclosure is made to solve the above point, and aims at suppressing occurrence of conversion error.

RELATED-ART DOCUMENTS

Patent Documents

[Patent Document 1] Japanese Patent No. 5267223
[Patent Document 2] Japanese National Publication of International Patent Application No. 2012-511284
[Patent Document 3] Japanese Laid-Open Patent Publication No. 2011-188240

SUMMARY OF THE INVENTION

A technique disclosed in the present disclosure is related to a comparator including a first circuit including first, second, and third transistors, and a second circuit. One of the first transistor and the second transistor in the first circuit is an input transistor to which an input analog voltage is applied. The third transistor is configured to short-circuit a drain and a source of each of the first transistor and the second transistor during a period when the input analog voltage is applied. The second circuit is configured to output a signal indicating a relationship between magnitude of a first output analog voltage and magnitude of a second output analog voltage, the first output analog voltage and the second output analog voltage being output from the first circuit based on the input analog voltage.

DETAILED DESCRIPTION OF THE PREFERRED EMBODIMENTS

First Embodiment

Figure 1:
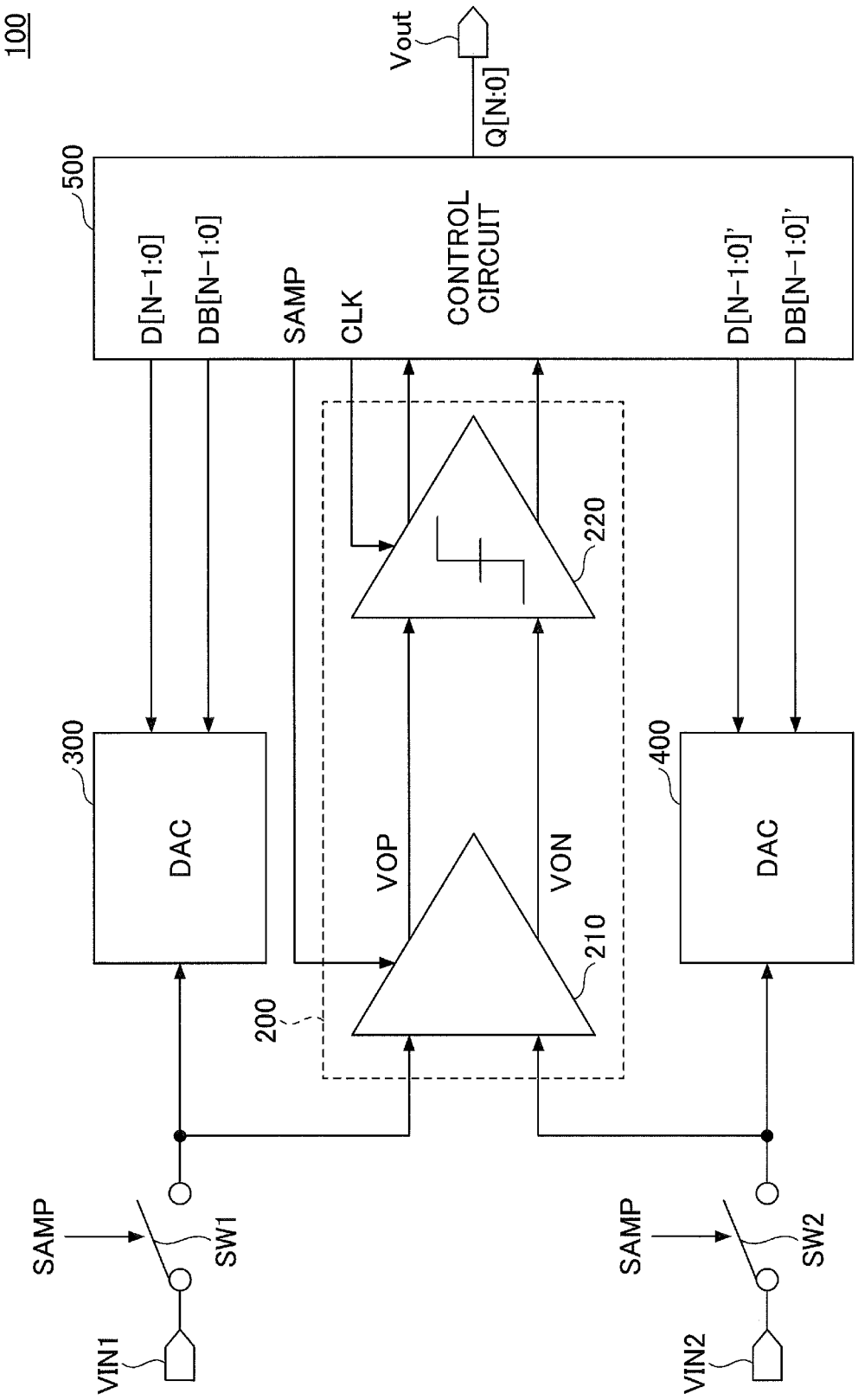
FIG. 1 is a diagram illustrating an analog-to-digital converter according to a first embodiment.

In the following, a first embodiment will be described with reference to the drawings. FIG. 1 is a diagram illustrating an analog-to-digital converter according to the first embodiment.

The analog-to-digital converter (hereinafter referred to as "AD converter") 100 according to the present embodiment is a successive approximation AD converter, which includes input terminals VIN1 and VIN2, an output terminal Vout, switches SW1 and SW2, a comparator 200, capacitive digital-to-analog (DA) converters 300 and 400, and a control circuit 500.

In the AD converter 100 according to the present embodiment, the control circuit 500 generates a control signal SAMP for turning on or off the switches SW1 and SW2 in accordance with a sampling frequency, and supplies the control signal SAMP to the switches SW1 and SW2 and the comparator 200. The control circuit 500 also supplies control signals to the capacitive DA converters 300 and 400, in accordance with signals output from the comparator 200.

When the switches SW1 and SW2 in the AD converter 100 are turned on, an analog electric potential input from the input terminal VIN1 and analog electric potential input from the input terminal VIN2 are respectively input to one input terminal and the other input terminal of the comparator 200. The comparator 200 samples the analog electric potentials applied to the respective input terminals, and outputs, to the control circuit 500, a digital signal indicating a relationship between magnitude of one of the analog electric potentials and magnitude of the other one of the analog electric potentials. In the following description, a period while the switches SW1 and SW2 are turned on is referred to as a sampling period.

When the switches SW1 and SW2 in the AD converter 100 are turned off, the capacitive DA converters 300 and 400 each output analog electric potentials corresponding to the control signals supplied from the control circuit 500, and input the analog electric potentials to the comparator 200. The comparator 200 outputs, to the control circuit 500, a result of determining a magnitude relationship of the two analog electric potentials that are respectively output from the capacitive DA converters 300 and 400. The control circuit 500 outputs a digital signal indicating the result of determining a magnitude relationship of the two analog electric potentials that are respectively output from the capacitive DA converters 300 and 400, as an output of the AD converter 100. In the following description, a period while the switches SW1 and SW2 are turned off is referred to as a compare-determination period.

To each of the input terminal VIN1 and the input terminal VIN2 in the AD converter 100 of the present embodiment, an analog electric potential is applied. Note that, in the present embodiment, an electric potential (such as an "analog electric potential") means a potential difference between the electric potential and a ground potential (an electrical potential of a point in a circuit to which a ground voltage (0 V) is applied). Also, unless otherwise stated, the electric potential may also be referred to as a "voltage". The input terminal VIN1 is connected to one end of the switch SW1, and the other end of the switch SW1 is connected to an input terminal of the capacitive DA converter 300. The other end of the switch SW1 is also connected to one input terminal of the comparator 200.

The input terminal VIN2 in the AD converter 100 is connected to one end of the switch SW2, and the other end of the switch SW2 is connected to an input terminal of the capacitive DA converter 400. The other end of the switch SW2 is also connected to the other input terminal of the comparator 200. Output of the comparator 200 is supplied to the control circuit 500.

Based on the output of the comparator 200, the control circuit 500 outputs, from the output terminal Vout, a difference (potential difference) between an analog voltage Vin1 input to the input terminal VIN1 and an analog voltage Vin2 input to the input terminal VIN2, as a digital value.

The control circuit 500 generates and outputs the control signal SAMP (digital signal) for controlling an on or off state of the switches SW1 and SW2. The control circuit 500 also generates control signals D[N-1:0] and DB[N-1:0] (digital signals) for controlling switches in the capacitive DA converter 300, and outputs them to the capacitive DA converter 300. Note that the letter N in the previous sentence represents an integer. Further, the control circuit 500 generates control signals D[N-1:0]' and DB[N-1:0]' (digital signals) for controlling switches in the capacitive DA converter 400, and outputs them to the capacitive DA converter 400. The control signals D[N-1:0], DB[N-1:0], D[N-1:0]', and DB[N-1:0]' are signals synchronized with an internal clock signal of the control circuit 500.

The comparator 200 in the present embodiment includes a preamp 210 (first circuit) and a comparator circuit 220 (second circuit). The preamp 210 is placed at an input stage of the comparator 200, and a first input terminal and a second input terminal of the preamp 21 respectively correspond to the one input terminal and the other input terminal of the comparator 200.

The preamp 210 is, for example, a differential amplifier. When the switches SW1 and SW2 are turned on (during sampling period), the analog voltage Vin1 (first input analog voltage) and the analog voltage Vin2 (second input analog voltage) are applied to the first and second input terminals of the preamp 210 respectively. The analog voltage Vin1 and the analog voltage Vin2 may vary complementarily with each other.

When the switches SW1 and SW2 are turned off (compare-determination period), analog voltage that is output from the capacitive DA converter 300 and analog voltage that is output from the capacitive DA converter 400 are applied to the first and second input terminals of the preamp 210 respectively.

The preamp 210 includes output terminals VOP and VON. The preamp 210 amplifies a difference of the analog voltage input to the first input terminal and the analog voltage input to the second input terminal, and outputs the amplified difference to the output terminals VOP and VON. The amplified difference corresponds to a difference between a voltage of the output terminal VOP and a voltage of the output terminal VON.

As described above, in the present embodiment, the analog voltages Vin1 and Vin2 are sampled by the switches SW1 and SW2 and the preamp 210, and by the sampled analog voltages Vin1 and Vin2, the capacitive DA converters 300 and 400 are charged.

One input terminal of the comparator circuit 220 is connected to the output terminal VOP, and the analog voltage output from the output terminal VOP is applied to the input terminal of the comparator circuit 220. The other input terminal of the comparator circuit 220 is connected to the output terminal VON, and the analog voltage output from the output terminal VON is applied to the other input terminal of the comparator circuit 220.

The comparator circuit 220 compares the two analog voltages input to the comparator circuit 220, and outputs a digital signal indicating a magnitude relationship of the two analog voltages to the control circuit 500.

Next, a structure of the capacitive DA converters 300 and 400 according to the present embodiment will be described with reference to FIGS. 2 and 3. In the following description, although the structure of the capacitive DA converter 300 is mainly described, the structure of the capacitive DA converter 400 according to the present embodiment is similar to that of the capacitive DA converter 300 to be described below.

Figure 2:
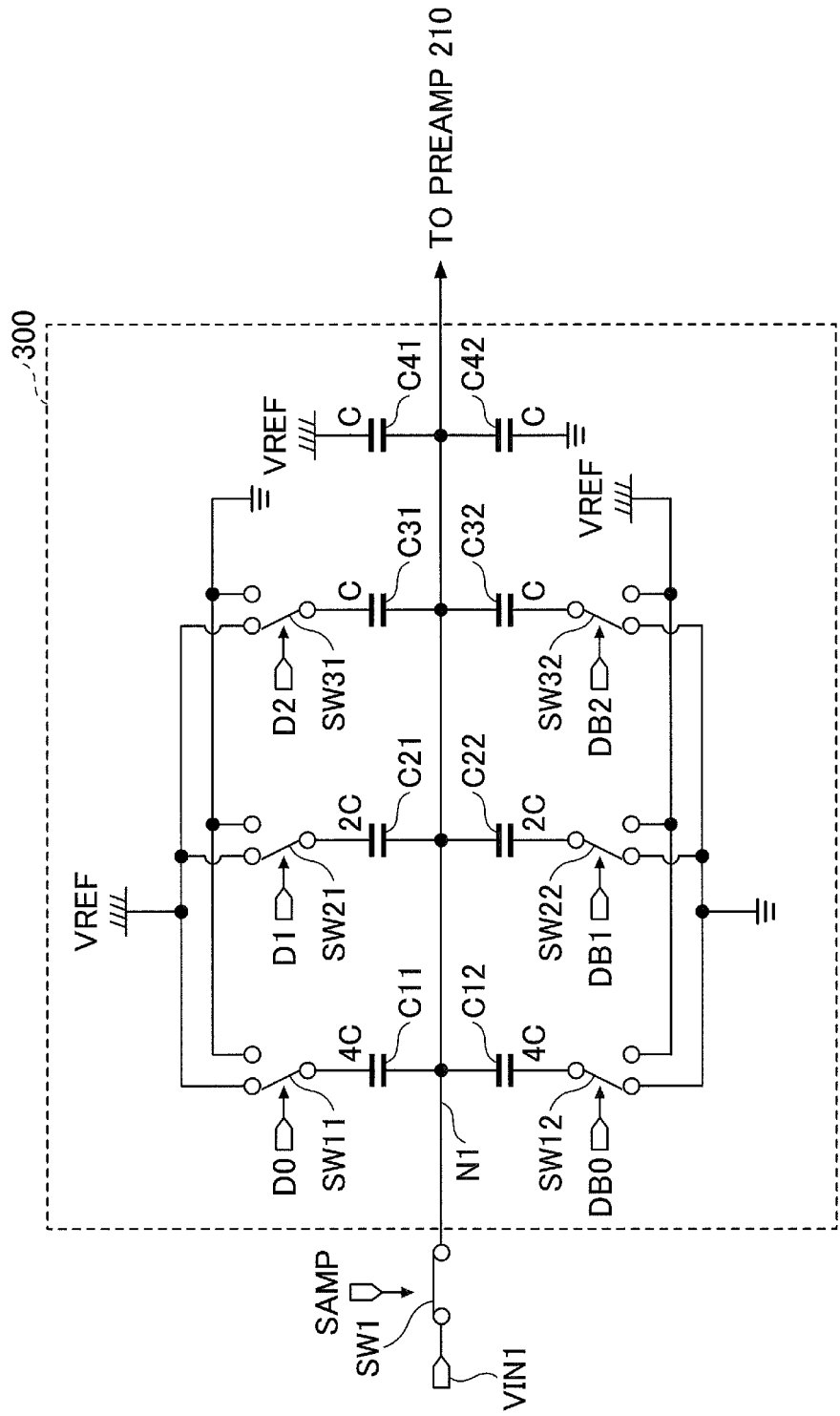
FIG. 2 is a first diagram illustrating a capacitive DA converter according to the first embodiment.

FIG. 2 is a first diagram illustrating the capacitive DA converter according to the first embodiment. The capacitive DA converter 300 according to the first embodiment includes capacitors C11, C21, C31, C41, C12, C22, C32, and C42, and switches SW11, SW21, SW31, SW12, SW22, and SW32.

By the above-described capacitors, the 3-bit capacitive DA converter 300 is configured. A symbol "nC" (n is an integer of 1, 2, or 4) added to each of the capacitors in FIG. 2 represents a relative magnitude of capacitance of a corresponding capacitor among the capacitors. In the example of FIG. 2, as the relative magnitude of capacitance of the capacitors is defined as 1C, 2C, and 4C, the capacitors are binary-weighted capacitors.

Top plates of the capacitors C11, C21, C31, C41, C12, C22, C32, and C42 are connected to a common node N1. The node N1 is connected to the other end of the switch SW1. The node N1 is also connected to the first input terminal of the preamp 210.

One end of the switch SW11 is connected to a bottom plate of the capacitor C11. One end of the switch SW21 is connected to a bottom plate of the capacitor C21. One end of the switch SW31 is connected to a bottom plate of the capacitor C31. To a bottom plate of the capacitor C41, a reference voltage (VREF) is applied.

One end of the switch SW12 is connected to a bottom plate of the capacitor C12. One end of the switch SW22 is connected to a bottom plate of the capacitor C22. One end of the switch SW32 is connected to a bottom plate of the capacitor C32. To a bottom plate of the capacitor C42, a ground potential (ground voltage) is applied.

The reference voltage or the ground voltage is applied to the other end of the switch SW11 in accordance with a control signal D[0] (may also be referred to as "D0") supplied from the control circuit 500. The reference voltage or the ground voltage is applied to the other end of the switch SW21 in accordance with a control signal D[1] (may also be referred to as "D1") supplied from the control circuit 500. The reference voltage or the ground voltage is applied to the other end of the switch SW31 in accordance with a control signal D[2] (may also be referred to as "D2") supplied from the control circuit 500.

The reference voltage or the ground voltage is applied to the other end of the switch SW12 in accordance with a control signal DB[0] (may also be referred to as "DB0") supplied from the control circuit 500. The reference voltage or the ground voltage is applied to the other end of the switch SW22 in accordance with a control signal DB[1] (may also be referred to as "DB1") supplied from the control circuit 500. The reference voltage or the ground voltage is applied to the other end of the switch SW32 in accordance with a control signal DB[2] (may also be referred to as "DB2") supplied from the control circuit 500.

In FIG. 2, a state of the sampling period in which the switch SW1 is turned on is illustrated. During the sampling period, the switches SW11, SW21, and SW31 apply the reference voltage to the respective bottom plates of the capacitors C11, C21, and C31. Further, the switches SW12, SW22, and SW32 apply the ground voltage to the respective bottom plates of the capacitors C12, C22, and C32. Each of these capacitors is charged by the analog voltage Vin1.

Figure 3:
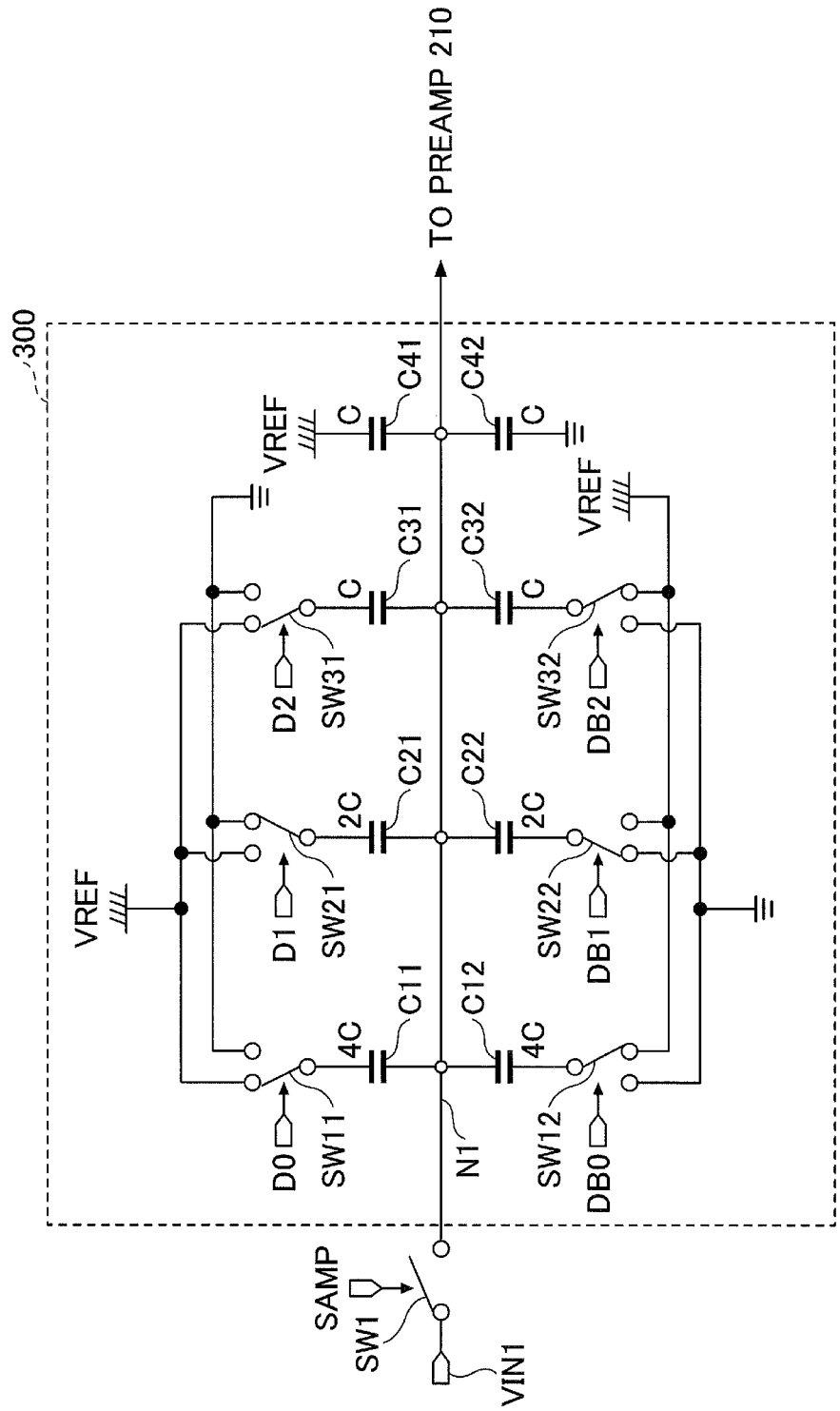
FIG. 3 is a second diagram illustrating the capacitive DA converter according to the first embodiment.

FIG. 3 is a second diagram illustrating the capacitive DA converter according to the first embodiment. In FIG. 3, a state of the compare-determination period in which the switch SW1 is turned off is illustrated.

During the compare-determination period, states (on/off states) of the switches SW11, SW21, and SW31 are controlled by the control signals D0, D1, and D2, respectively, and states (on/off states) of the switches SW12, SW22, and SW32 are controlled by the control signals DB0, DB1, and DB2, respectively.

During the compare-determination period, voltage of the top plates of the capacitors C11, C21, C31, C41, C12, C22, C32, and C42 is applied to the first input terminal of the preamp 210.

Figure 4:
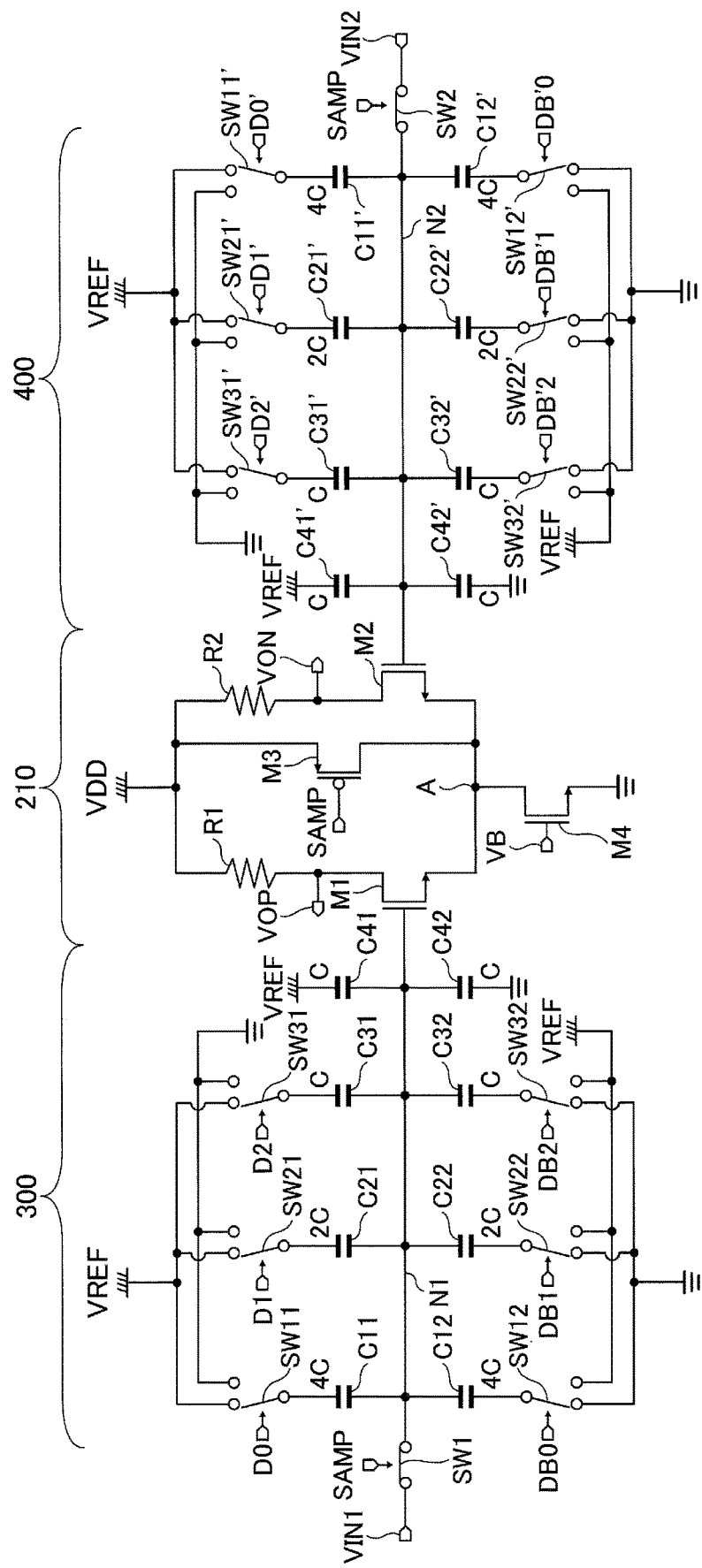
FIG. 4 is a first diagram illustrating a preamp according to the first embodiment.

Next, a structure of the preamp 210 according to the present embodiment will be described with reference to FIGS. 4 and 5. FIG. 4 is a first diagram illustrating the preamp according to the first embodiment.

The preamp 210 includes transistors M1, M2, M3, and M4, resistors R1 and R2, and the output terminals VOP and VON.

The transistors M1 and M2 form a differential pair. For example, the transistor M1 is a first transistor of the preamp 210, and the transistor M2 is a second transistor of the preamp 210.

The transistor M3 functions as a switch to fix a drain-source voltage drop of the transistors M1 and M2. The transistor M3 is a third transistor of the preamp 210. With respect to the transistor M4, as a predetermined voltage VB is applied to a gate of the transistor M4, the transistor M4 functions as a current source.

In the preamp 210, a power supply voltage VDD is applied to one end of the resistor R1, and the other end of the resistor R1 is connected to a drain of the transistor M1. A gate of the transistor M1 corresponds to the first input terminal of the preamp 210, and is connected to the common node N1 to which the top plates of the capacitors C11, C21, C31, C41, C12, C22, C32, and C42 are connected.

A source of the transistor M1 is connected to a drain of the transistor M4. To the gate of the transistor M4, the predetermined voltage VB is applied, and a source of the transistor M4 is grounded.

The power supply voltage VDD is also applied to one end of the resistor R2, and the other end of the resistor R2 is connected to a drain of the transistor M2. A gate of the transistor M2 corresponds to the second input terminal of the preamp 210, and is connected to a common node N2 to which top plates of capacitors C11', C21', C31', C41', C12', C22', C32', and C42' of the capacitive DA converter 400 are connected. A source of the transistor M2 is connected to the drain of the transistor M4.

A structure of the capacitive DA converter 400 will be described briefly. The capacitive DA converter 400 includes the capacitors C11', C21', C31', C41', C12', C22', C32', and C42', and switches SW11', SW21', SW31', SW12', SW22', and SW32'. The top plates of capacitors C11', C21', C31', C41', C12', C22', C32', and C42' are connected to the common node N2, and the common node N2 is connected the other end of the switch SW2. The common node N2 is also connected to the second input terminal of the preamp 210. Bottom plates of the capacitors C11', C21', and C31' are connected to one end of the switches SW11', SW21', and SW31' respectively. Bottom plates of the capacitors C12', C22', and C32' are connected to one end of the switches SW12', SW22', and SW32' respectively. To a bottom plate of the capacitor C41', the reference voltage (VREF) is applied. To a bottom plate of the capacitor C42', the ground voltage is applied.

The reference voltage or the ground voltage is applied to the other end of the switches SW11', SW21', and SW31' in accordance with corresponding control signals D[0]', D[1]', and D[2]' (may also be referred to as D0', D1', and D2', respectively). The reference voltage or the ground voltage is applied to the other end of the switches SW12', SW22', and SW32' in accordance with corresponding control signals DB[0]', DB[1]', and DB[2]' (may also be referred to as DB0', DB1', and DB2', respectively).

The power supply voltage VDD is applied to a source of the transistor M3, and the control signal SAMP for controlling on and/or off states of the switches SW1 and SW2 is applied to a gate of the transistor M3. A drain of the transistor M3 is connected to the drain of the transistor M4.

In the preamp 210 of the present embodiment, during the sampling period, the transistor M3 is turned on, and a voltage (source voltage) of the source of the transistors M1 and M2 is fixed to the power supply voltage VDD. In other words, while the analog voltages Vin1 and Vin2 are applied to the transistors M1 and M2 respectively, the transistor M3 short-circuits the drain and the source of each of the transistors M1 and M2.

As a result, because drain-source voltage drop of each of the transistors M1 and M2 becomes 0 V, gate capacitance of each of the transistors M1 and M2 becomes equal. Note that a gate capacitance means a capacitance formed between a gate electrode and an active layer.

As FIG. 4 illustrates a state of the sampling period, the switches SW1 and SW2, and the transistor M3 are turned on by the control signal SAMP.

Also, during the sampling period, in the capacitive DA converter 300, the reference voltage is applied to the bottom plates of the capacitors C11, C21, and C31 by the switches SW11, SW21, and SW31 respectively, and the ground voltage is applied to the bottom plates of the capacitors C12, C22, and C32 by the switches SW12, SW22, and SW32 respectively. As a result, each of these capacitors is charged in accordance with a voltage between the reference voltage and the analog voltage Vin1, or between the analog voltage Vin1 and the ground voltage. Similarly in the capacitive DA converter 400, during the sampling period, the reference voltage is applied to the bottom plates of the capacitors C11', C21', and C31' by the switches SW11', SW21', and SW31' respectively, and the ground voltage is applied to the bottom plates of the capacitors C12', C22', and C32' by the switches SW12', SW22', and SW32' respectively. As a result, each of these capacitors is charged in accordance with a voltage between the reference voltage and the analog voltage Vin2, or between the analog voltage Vin2 and the ground voltage.

Note that FIG. 4 illustrates a case in which a p-type transistor is used for the transistor M3. However, other types of switching elements may be used. Examples of the other types of switching elements include an n-type transistor, and a combination of a p-type transistor and an n-type transistor both of which are connected in parallel.

Figure 5:
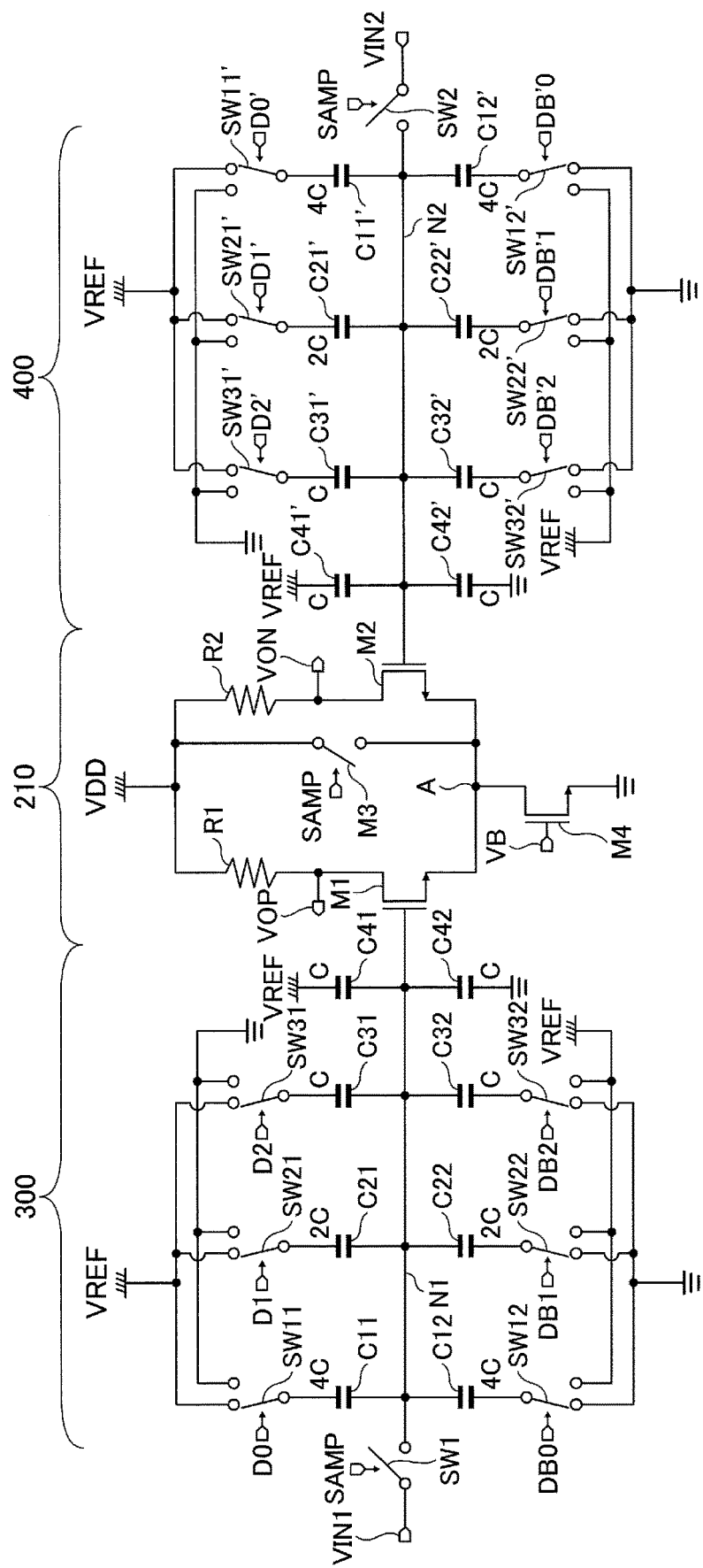
FIG. 5 is a second diagram illustrating the preamp according to the first embodiment.

FIG. 5 is a second diagram illustrating the preamp according to the first embodiment. As FIG. 5 illustrates a state of the compare-determination period, the switches SW1 and SW2, and the transistor M3 are turned off by the control signal SAMP.

During the compare-determination period, a voltage of the top plate of each of the capacitors in the capacitive DA converter 300 is applied to the gate of the transistor M1, and a voltage of the top plate of each of the capacitors in the capacitive DA converter 400 is applied to the gate of the transistor M2.

Note that, when entering the compare-determination period, a state of each of the switches in the capacitive DA converter 300 and the capacitive DA converter 400 is changed in accordance with the control signals D[N-1:0], DB[N-1:0], D[N-1:0]', and DB[N-1:0]'. Thus, the voltage of the top plates applied to the gate of the transistor M1 and the voltage of the top plates applied to the gate of the transistor M2 are determined depending on the states of the switches.

The voltages of the output terminals VOP and VON of the preamp 210 are entered to the comparator circuit 220, and the comparator circuit 220 determines a magnitude relation of the voltages.

As described above, in the present embodiment, because the drain-source voltage drop of each of the transistors M1 and M2 is fixed to 0 V by the transistor M3, difference of the gate capacitance of each of the transistors M1 and M2 can be eliminated. In other words, regardless of a difference (electric potential difference) between the analog voltage Vin1 and the analog voltage Vin2 during the sampling period, the gate capacitance of each of the transistors M1 and M2 can be made to be substantially equal.

Therefore, according to the present embodiment, error of sampled analog voltage can be reduced, and as a result, occurrence of conversion error in analog-to-digital conversion can be suppressed.

Figure 6:
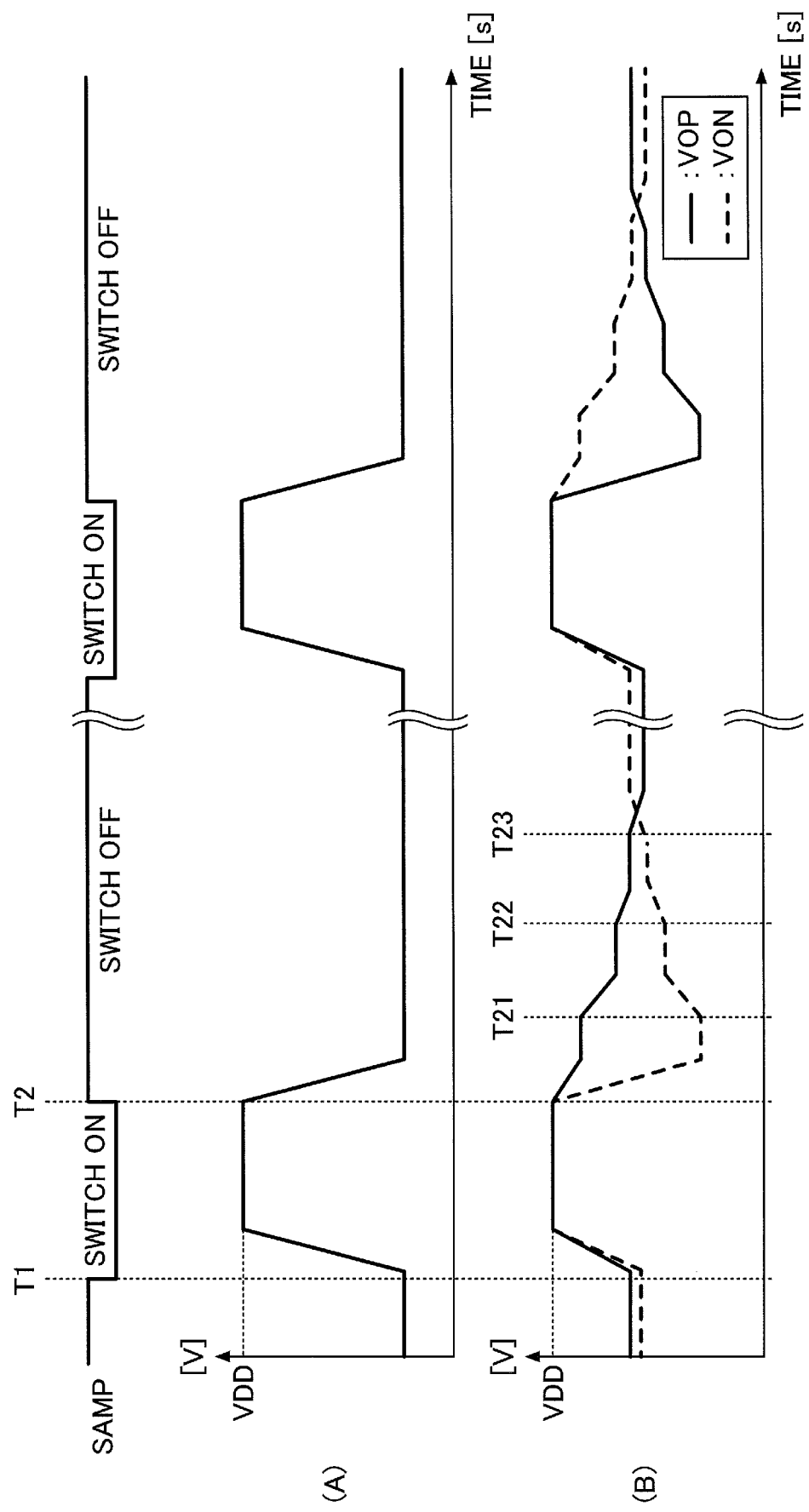
FIG. 6 is a timing chart illustrating an operation of the preamp according to the first embodiment.

Next, an operation of the preamp 210 according to the present embodiment will be described with reference to FIG. 6. FIG. 6 is a timing chart illustrating the operation of the preamp according to the first embodiment.

In FIG. 6, a waveform of the control signal SAMP, a waveform of a voltage at a connecting point A in the preamp 210 (a graph (A) in FIG. 6), and waveforms of voltages of the output terminals VOP and VON of the preamp 210 (a graph (B) in FIG. 6), are illustrated. Note that the connecting point A indicates a point at which the sources of the transistors M1 and M2 and the drain of the transistor M4 are connected, and that the voltage at the connecting point represents source voltages (voltages of sources) of the transistors M1 and M2. Also, with respect to the graph (B) of FIG. 6, a solid line (curve) represents a waveform of the voltage of the output terminal VOP, and a dashed line (curve) represents a waveform of the voltage of the output terminal VON.

In the present embodiment, when the control signal SAMP is changed from a high level (H level) to a low level (L level) at time T1, the switches SW1 and SW2, and the transistor M3 are turned on, and the sampling period begins.

At this time, the source voltages of the transistors M1 and M2 are fixed to the power supply voltage VDD by the transistor M3. And, the voltages of the output terminals VOP and VON become the power supply voltage VDD.

Next, at time T2, when the control signal SAMP is reversed from the L level to the H level, the switches SW1 and SW2, and the transistor M3 are turned off, and the compare-determination period begins.

In the present embodiment, when the control signal SAMP is reversed from the L level to the H level, the source voltages of the transistors M1 and M2 are returned to states before the source voltages of the transistors M1 and M2 were fixed to the power supply voltage VDD, and the preamp 210 starts operating.

At this time, the voltage of the top plate of each of the capacitors in the capacitive DA converter 300 is applied to the first input terminal of the preamp 210, and the voltage of the top plate of each of the capacitors in the capacitive DA converter 400 is applied to the second input terminal of the preamp 210. The voltages of the output terminals VOP and VON become voltages in accordance with the voltages input to the preamp 210.

During the compare-determination period, the control circuit 500 according to the present embodiment generates the control signals D[N-1:0], DB[N-1:0], D[N-1:0]', and DB[N-1:0]', based on a compared result indicated by the output signal of the comparator circuit 220, and supplies the control signals to the capacitive DA converters 300 and 400.

For example, the control circuit 500 performs the compare-determination by determining values of the control signals D[N-1:0], DB[N-1:0], D[N-1:0]', and DB[N-1:0]' bit by bit, from the most significant bit to the least significant bit. In the example of FIG. 6, the comparator circuit 220 performs the compare-determination at times T21, T22, and T23.

As described above, in the present embodiment, because the source voltage of each of the transistors M1 and M2 is fixed to the power supply voltage VDD to set the drain-source voltage drop of each of the transistors M1 and M2 to 0 V, dependency on input voltage can be eliminated from the gate capacitance of each of the transistors M1 and M2.

The comparator 200 in the present embodiment outputs a result of the compare-determination as a differential pair of signals, but is not limited thereto. The comparator 200 may output a result of the compare-determination as a single-ended signal.

In the present embodiment, because the output of the comparator 200 is the differential pair of signals, the control circuit 500 can generate the control signals D[N-1:0], DB[N-1:0], D[N-1:0]', and DB[N-1:0]', by using this differential pair of signals.

Figure 7:
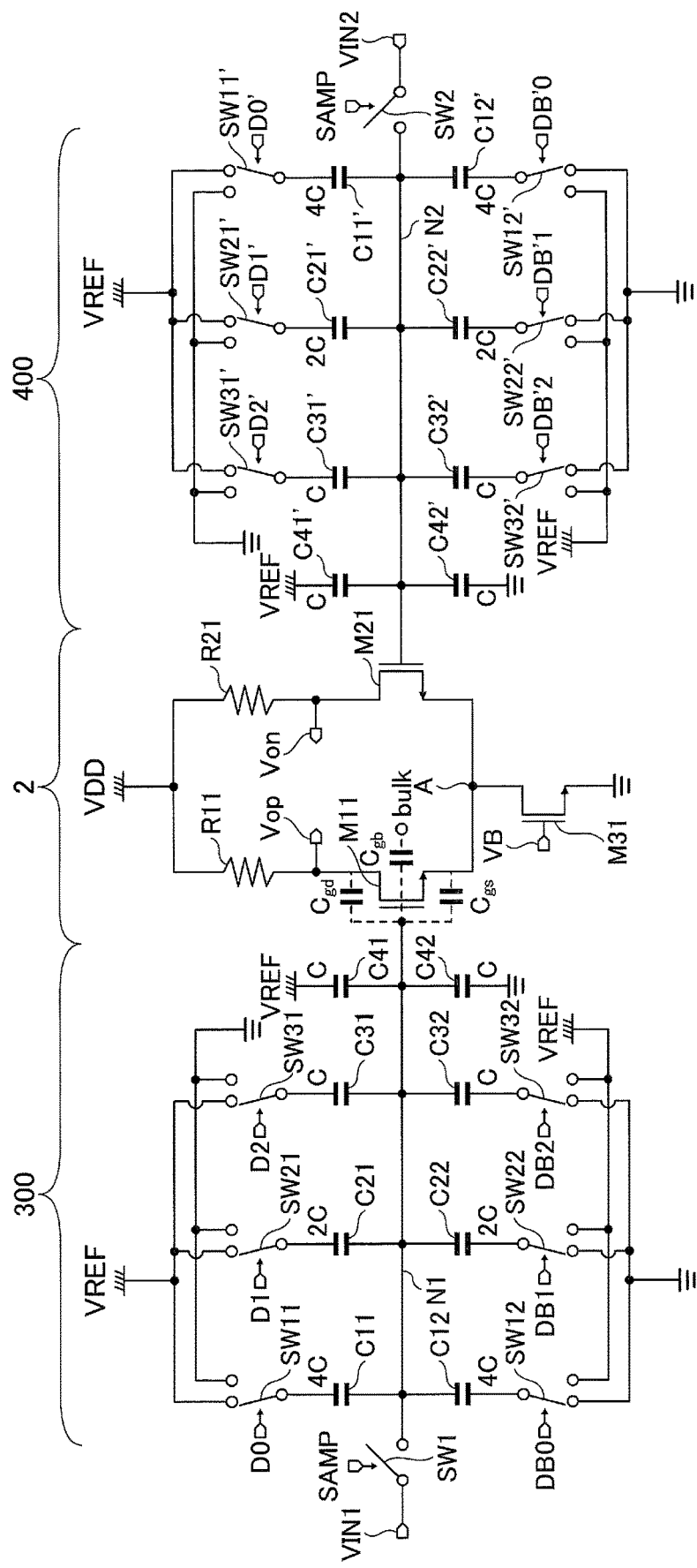
FIG. 7 is a first diagram illustrating a comparative example.

Next, an effect of the present embodiment will be described with reference to a comparative example. FIG. 7 is a first diagram illustrating the comparative example.

In FIG. 7, top plates of capacitors of the capacitive DA converter 300 and one end of a switch SW1 are connected to one input terminal of a preamp 2 to which a technique according to the present embodiment is not applied, and top plates of capacitors of the capacitive DA converter 400 and one end of a switch SW2 are connected to the other input terminal of the preamp 2.

The preamp 2 includes resistors R11 and R21, transistors M11, M21, and M31, and output terminals Vop and Von.

A power supply voltage VDD is applied to a drain of the transistor M11 and a drain of the transistor M21, via the resistors R11 and R12 respectively. Each source of the transistors M11 and M21 is connected to a drain of the transistor M31. A predetermined voltage is applied to a gate of the transistor M31, and a source of the transistor M31 is grounded. Thus, the transistor M31 functions as a current source.

During the sampling period, an analog voltage Vin1 that is input to an input terminal VIN1 and an analog voltage Vin2 that is input to an input terminal VIN2 are applied to gates of the transistors M11 and M21 respectively.

Here, voltages of gates of the transistors M11 and M21 will be reviewed. Note that the gate of the transistor M11 corresponds to a non-inverting input terminal of the preamp 2, and that the gate of the transistor M21 corresponds to an inverting input terminal of the preamp 2.

Let a gate capacitance of the transistor M11 be Ccom11, and a capacitance of the capacitive DA converter 300 be Cdac3. The voltage of the gate of the transistor M11 is determined based on a sum of the capacitance Cdac3 and the capacitance Ccom11. Also, let a gate capacitance of the transistor M21 be Ccom21, and a capacitance of the capacitive DA converter 400 be Cdac4. The voltage of the gate of the transistor M21 is determined based on a sum of the capacitance Cdac4 and the capacitance Ccom21.

The gate capacitance Ccom11 of the transistor M11 is a sum of parasitic capacitance between its gate and drain (Cgd), parasitic capacitance between its gate and source (Cgs), and parasitic capacitance between its gate and bulk (Cgb). The gate capacitance Ccom11 varies in accordance with the analog voltage Vin1.

Also, the gate capacitance Ccom21 of the transistor M21 is a sum of parasitic capacitance between its gate and the drain, parasitic capacitance between its gate and source, and parasitic capacitance between its gate and bulk (not illustrated). The gate capacitance Ccom21 varies in accordance with the analog voltage Vin2.

Conversely, the capacitance Cdac3 of the capacitive DA converter 300 and the capacitance Cdac4 of the capacitive DA converter 400 do not depend on the analog voltages Vin1 and Vin2.

Thus, in the comparative example illustrated in FIG. 7, the voltages of the gates of the transistors M11 and M12 forming a differential pair of the preamp 2 become different in accordance with a difference between the analog voltages Vin1 and Vin2. Especially, in the comparative example, in a case in which the difference between the analog voltages Vin1 and Vin2 is large, a difference between a gate-source voltage drop of a transistor for a non-inverting input and a gate-source voltage drop of a transistor for an inverting input becomes large, and a difference between the gate capacitance Ccom11 and the gate capacitance Ccom21 becomes large.

Figure 8:
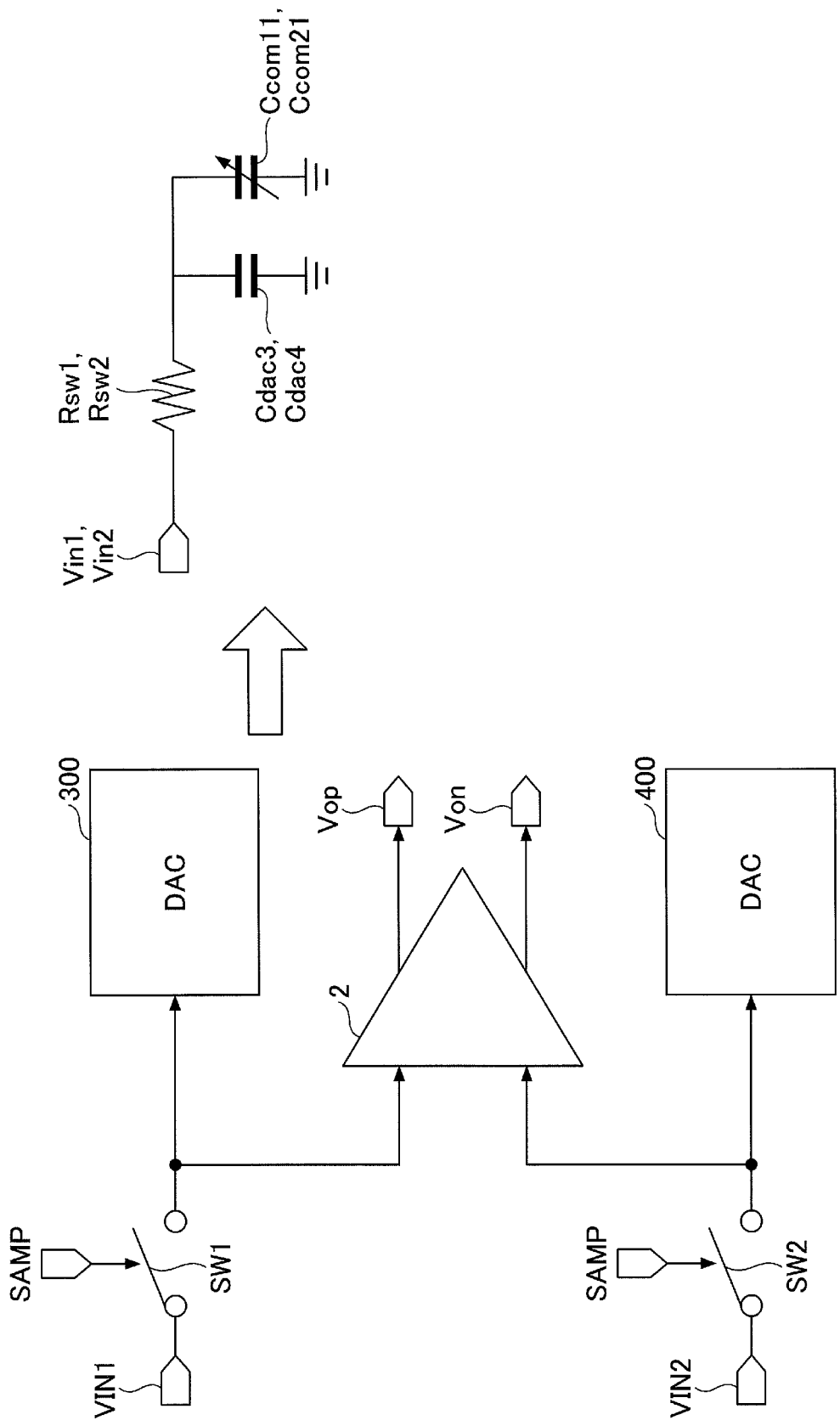
FIG. 8 is a second diagram illustrating the comparative example.

FIG. 8 is a second diagram illustrating the comparative example. In FIG. 8, a block diagram of the circuit illustrated in FIG. 7, and an equivalent circuit of the block diagram are illustrated.

In the equivalent circuit, electric resistance of the switches SW1 and SW2 are each denoted by Rsw1 and Rsw2, the capacitance of the capacitive DA converters 300 and 400 are each denoted by Cdac3 and Cdac4, and the gate capacitance of the transistors M11 and M21 are each denoted by Ccom11 and Ccom21.

The gate capacitance Ccom11 varies depending on the analog voltage Vin1. The gate capacitance Ccom21 varies depending on the analog voltage Vin2.

Thus, a difference occurs between capacitance (Cdac3+Ccom11) affecting the voltage of the gate of the transistor M11 and capacitance (Cdac4+Ccom21) affecting the voltage of the gate of the transistor M21. Because of the difference, an error occurs in a sampled voltage.

To avoid the problem, in the preamp 210 according to the present embodiment, because the drain-source voltage drop of each of the transistors M1 and M2 forming a differential pair is set to 0 V, the gate capacitance of each of the transistors M1 and M2 be substantially constant.

For example, in the comparative example, in a case in which the analog voltage Vin1 is 0.8 V and the analog voltage Vin2 is 0.2 V, a sum of the gate capacitance Ccom11 and the capacitance Cdac3 is 120 fF. Also, a sum of the gate capacitance Ccom21 and the capacitance Cdac4 is 55 fF.

Thus, in the comparative example, capacitance at the non-inverting input terminal deviates by 120% or greater, from capacitance at the inverting input terminal.

On the other hand, in the present embodiment, in a case in which the analog voltage Vin1 is 0.8 V and the analog voltage Vin2 is 0.2 V, a sum of the gate capacitance Ccom11 of the transistor M1 and the capacitance Cdac3 is 54 fF. Also, a sum of the gate capacitance Ccom21 of the transistor M2 and the capacitance Cdac4 is 50 fF.

Thus, in the present embodiment, deviation of the capacitance at the non-inverting input terminal from the capacitance at the inverting input terminal can be reduced to less than 10% of the capacitance at the inverting input terminal.

Figure 9A:
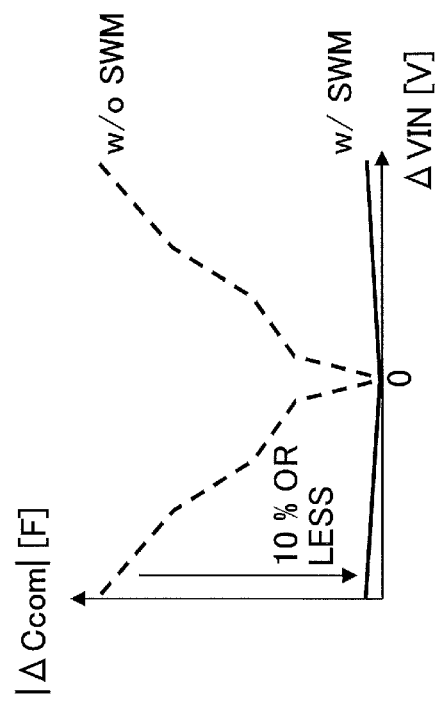
FIGS. 9A and 9B are a first set of diagrams explaining the effect of the first embodiment.
Figure 9B:
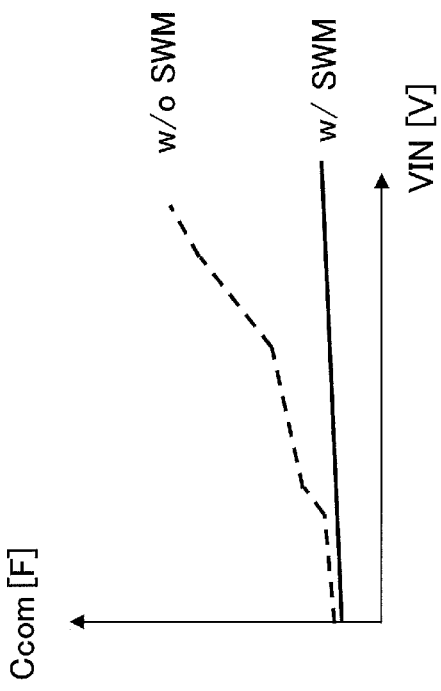

An effect of the present embodiment will be described in the following, with reference to FIGS. 9A, 9B, 10A, and 10B. FIGS. 9A and 9B are a first set of diagrams explaining the effect of the first embodiment. FIG. 9A is a graph indicating a relationship between a capacitance of a gate of a transistor forming a differential pair of a preamp disposed at an input stage of a comparator and an input voltage of the gate. FIG. 9B is a graph indicating a relationship between a difference of input voltages of the preamp and a difference of the gate capacitances of transistors forming a differential pair of the preamp.

In FIG. 9A, a solid line (curve) represents a relationship between a gate capacitance of one of transistors forming a differential pair of a preamp to which a technique of the present embodiment is applied and an input voltage, and a dashed line (curve) represents a relationship between a gate capacitance of one of transistors of a preamp to which a technique of the present embodiment is not applied and an input voltage. In FIG. 9B, a solid line (curve) represents a relationship between a difference of gate capacitances of transistors forming a differential pair of a preamp to which a technique of the present embodiment is applied and a difference of input voltages of the preamp, and a dashed line (curve) represents a relationship between a difference of gate capacitances of a preamp to which a technique of the present embodiment is not applied and a difference of input voltages of the preamp.

As can be seen from FIG. 9A, with respect to the preamp to which the technique of the present embodiment is not applied, the gate capacitance of the transistor varies in accordance with the input voltage. However, in a case in which the technique of the present embodiment is applied, the gate capacitance of the transistor is substantially constant regardless of the input voltage.

Also, as can be seen from FIG. 9B, with respect to the preamp to which the technique of the present embodiment is not applied, the difference between the gate capacitances of the transistors varies in accordance with the difference of the input voltages. However, in the case in which the technique of the present embodiment is applied, the difference between the gate capacitances of the transistors is smaller than the case in which the technique of the present embodiment is not applied. In the case in which the technique of the present embodiment is applied, the difference between the gate capacitances of the transistors could be reduced to not greater than 10% of the difference between the gate capacitances of the transistors in the case in which the technique of the present embodiment is not applied.

Note that the graphs in FIGS. 9A and 9B represent results that were obtained by simulations conducted based on a specification or the like of the AD converter 100.

Figure 10B:
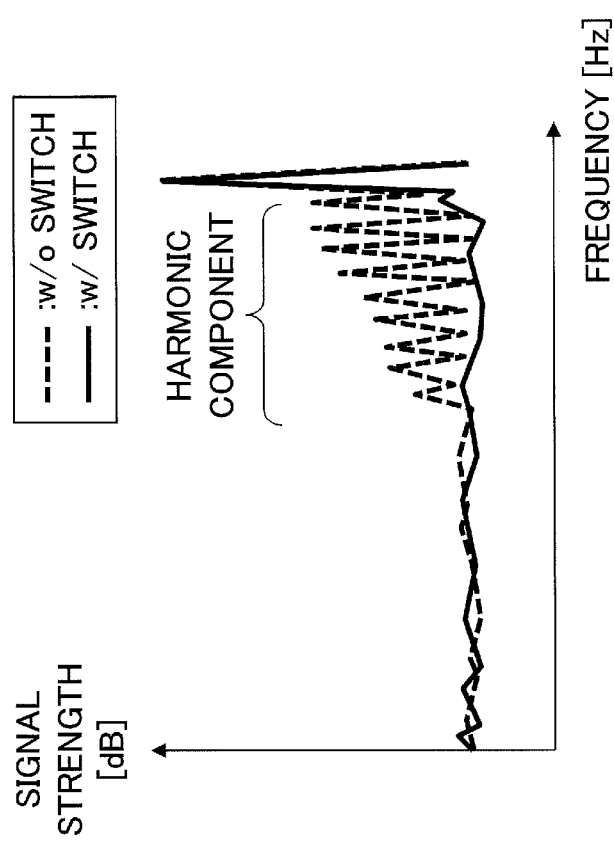
FIGS. 10A and 10B are a second set of diagrams explaining the effect of the first embodiment.
Figure 10A:
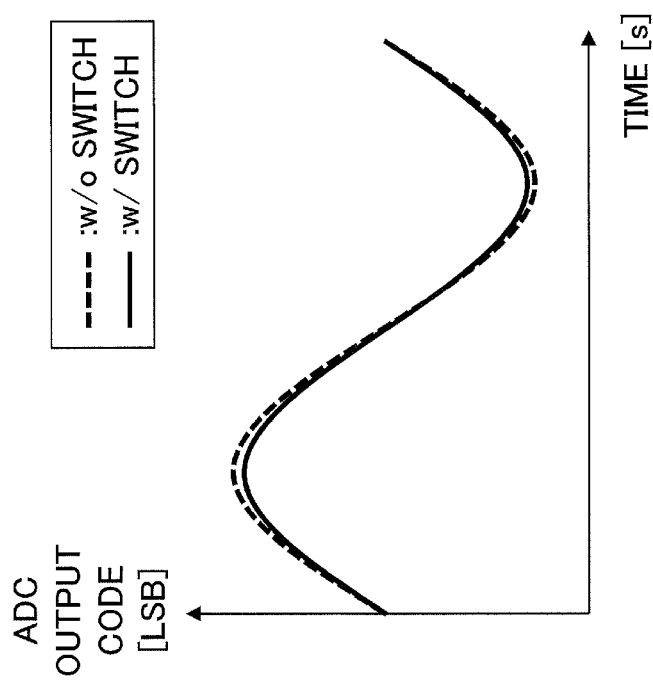

Next, with reference to FIGS. 10A and 10B, an effect of the present embodiment will be described. FIGS. 10A and 10B are a second set of diagrams explaining the effect of the first embodiment.

FIG. 10A is a graph illustrating a waveform of a result when a sine wave signal is input to the AD converter 100 of the present embodiment. FIG. 10B is a power spectrum of a frequency domain of the signal illustrated in FIG. 10A which is obtained by applying a Fourier transform to the signal.

In FIG. 10A and FIG. 10B, solid lines (curves) represent outputs from the AD converter 100 according to the present embodiment, and dashed lines (curves) represent outputs from an AD converter to which the technique of the present embodiment is not applied.

As can be seen from FIG. 10A, a difference occurs between an output from the AD converter 100 according to the present embodiment and an output from the AD converter to which the technique of the present embodiment is not applied, when magnitude of an output code is small or large.

Also, according to FIG. 10B, although a harmonic component can be observed from an output from the AD converter to which the technique of the present embodiment is not applied, a harmonic component is significantly reduced from an output from the AD converter 100 of the present embodiment. That is, it is found that a signal to noise and distortion ratio (SNDR) is improved in the present embodiment.

The SNDR is a noise characteristic of an AD converter. When the SNDR degrades, effective number of bits (ENOB) becomes smaller. Thus, improvement of the SNDR is preferable.

Second Embodiment

In the following, a second embodiment will be described with reference to the drawings. The second embodiment differs from the first embodiment in that a comparator in the second embodiment includes multiple preamps. In the following, differences between the second embodiment and the first embodiment are mainly described. Also, an element having a similar feature to that in the first embodiment is given the same reference symbol as that in the first embodiment, and description of the element is omitted.

Figure 11:
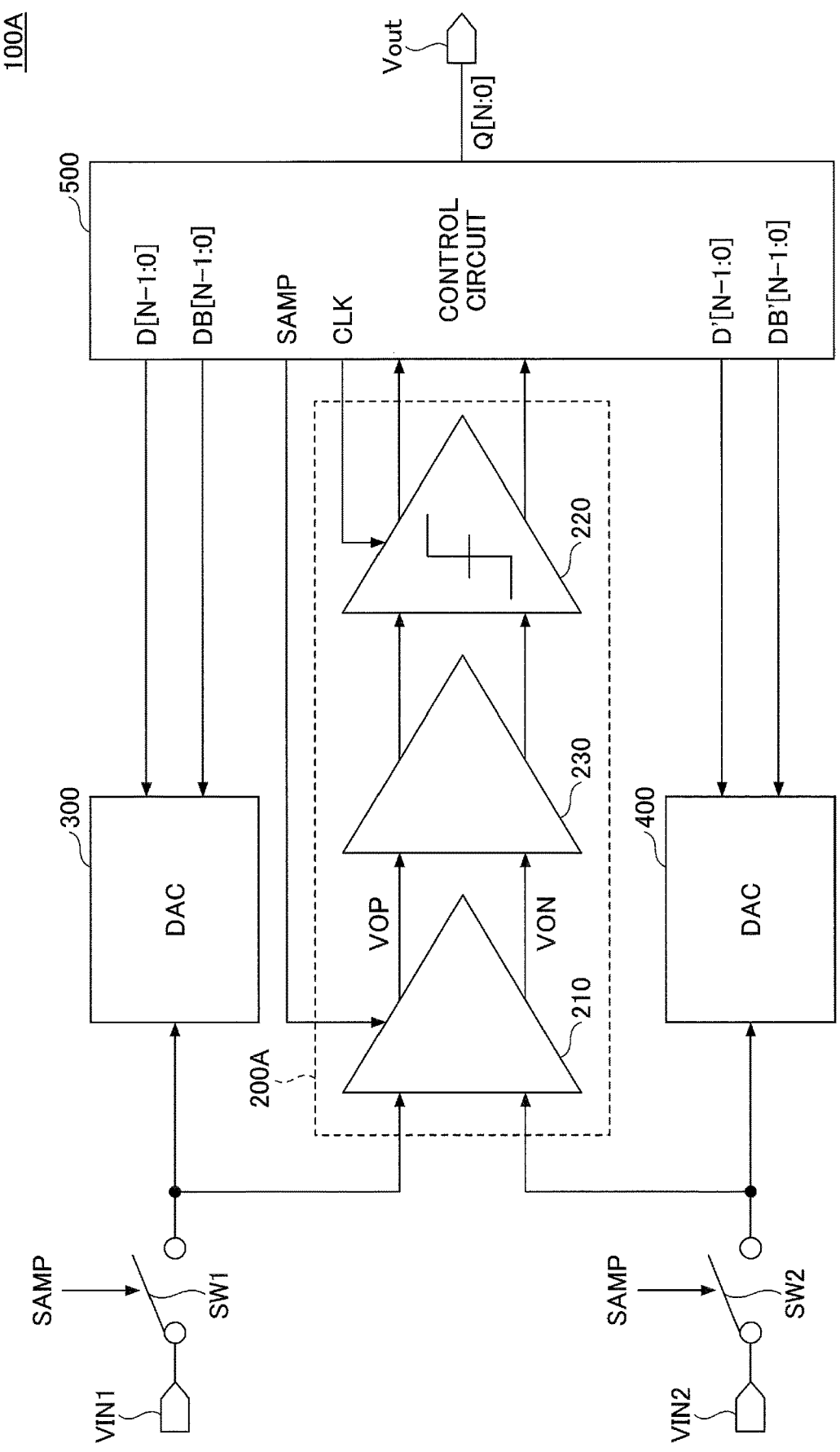
FIG. 11 is a diagram illustrating an analog-to-digital converter according to a second embodiment.

FIG. 11 is a diagram illustrating an analog-to-digital converter according to the second embodiment. The AD converter 100A according to the present embodiment includes input terminals VIN1 and VIN2, an output terminal Vout, switches SW1 and SW2, a comparator 200A, capacitive DA converters 300 and 400, and a control circuit 500.

The comparator 200A in the present embodiment includes a preamp 210, a comparator circuit 220, and an amplifier 230.

The amplifier 230 in the present embodiment is a generic amplifying stage, and does not include a switch unit corresponding to the transistor M3 in the preamp 210.

In the present embodiment, by providing the amplifier 230 between the preamp 210 and the comparator circuit 220, signals to be input to the comparator circuit 220 can be amplified. In the present embodiment, although a single stage of amplifier is provided between the preamp 210 and the comparator circuit 220, the number of stages is not limited to one. Multiple amplifiers may be provided at a stage subsequent to the preamp 210.

Third Embodiment

In the following, a third embodiment will be described with reference to the drawings. The third embodiment differs from the first embodiment in that a reference voltage divided by two is input to one of the input terminals of a comparator. In the following, differences between the third embodiment and the first embodiment are mainly described. Also, an element having a similar feature to that in the first embodiment is given the same reference symbol as that in the first embodiment, and description of the element is omitted.

Figure 12:
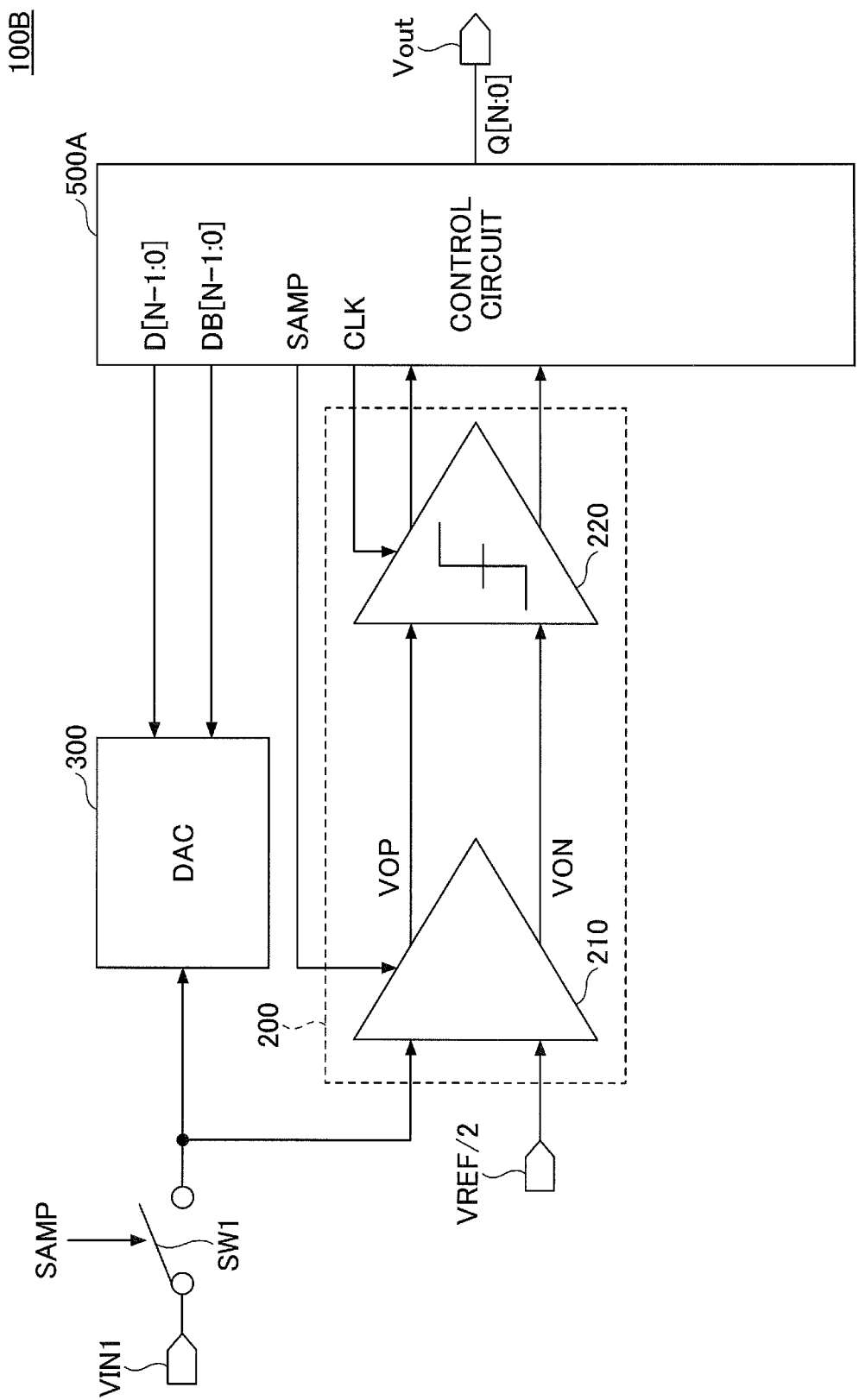
FIG. 12 is a diagram illustrating an analog-to-digital converter according to a third embodiment.

FIG. 12 is a diagram illustrating an analog-to-digital converter according to the third embodiment. The AD converter 100B according to the present embodiment includes an input terminal VIN1, an output terminal Vout, a switch SW1, a comparator 200, a capacitive DA converter 300, and a control circuit 500A.

In the present embodiment, an analog voltage Vin1 is input to a first input terminal of the preamp 210, and a reference voltage VREF/2 is input to a second input terminal of the preamp 210. According to this configuration, the AD converter 100B according to the present embodiment can be applied to a case in which an input analog voltage is not a differential input.

Fourth Embodiment

In the following, a fourth embodiment will be described with reference to the drawings. The fourth embodiment differs from the first embodiment in that a transistor M3 is not included and that a transistor M4 affecting voltage at a contacting point A is turned off during the sampling period in which switches SW1 and SW2 are turned off. In the following, differences between the fourth embodiment and the first embodiment are mainly described. Also, an element having a similar feature to that in the first embodiment is given the same reference symbol as that in the first embodiment, and description of the element is omitted.

Figure 13:
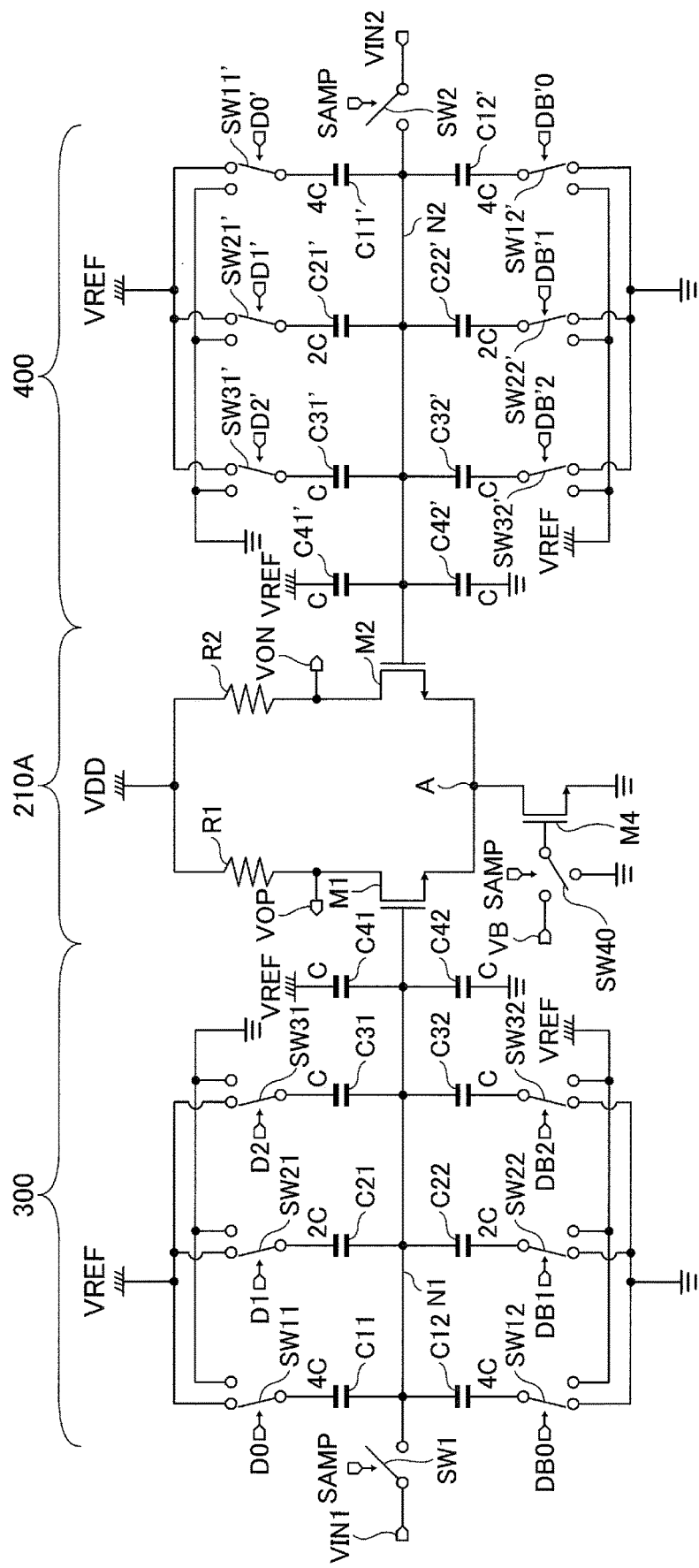
FIG. 13 is a diagram illustrating a preamp according to a fourth embodiment.

FIG. 13 is a diagram illustrating a preamp according to the fourth embodiment. The preamp 210A according to the present embodiment includes transistors M1, M2, and M4, resistors R1 and R2, output terminals VOP and VON, and a switch SW40.

In the preamp 210A according to the present embodiment, the switch SW40 is connected to a gate of the transistor M4. The switch SW40 switches voltage entered to the gate of the transistor M4 between a ground voltage and a predetermined voltage VB.

An on/off state of the switch SW40 is controlled by a control signal SAMP for turning on and/or off the switches SW1 and SW2. Specifically, while the switches SW1 and SW2 are turned on, the switch SW40 is connected to the ground voltage and the ground voltage is applied to the gate of the transistor M4. Also, while the switches SW1 and SW2 are turned off, the switch SW40 is connected to a point of the predetermined voltage VB, and the predetermined voltage VB is applied to the gate of the transistor M4. That is, while the switches SW1 and SW2 are turned off, the switch SW40 causes the transistor M4 to function as a current source.

In a case in which the ground voltage is applied to the gate of the transistor M4, because a resistance of the transistor M4 becomes much higher than combined resistance R' of resistances of the transistors M1 and M2 and resistances of the resistor R1 and R2, a voltage $V_A$ at the connecting point A rises to close to the power supply voltage VDD.

The combined resistance R' is expressed as the following equation (1). Note that, in the equation (1), $R_{M1}$ is a resistance of the transistor M1, and $R_{M2}$ is a resistance of the transistor M2.

$$R'=\{(R_1+R_{M1})\times(R_2+R_{M2})\}/(R_1+R_2+R_{M1}+R_{M2}) \quad (1)$$

Further, the voltage VA at the connecting point A is expressed as the following equation (2). Note that, in the equation (2), $R_{M4}$ is a resistance of the transistor M4.

$$V_A=\{R_{M4}/(R'+R_{M4})\}\times VDD \approx VDD \quad (2)$$

As described above, in the present embodiment, by applying the ground voltage to the gate of the transistor M4 during the sampling period in which the switches SW1 and SW2 are turned on, a voltage at the connecting point A can be made to be approximately the power supply voltage VDD. That is, in the present embodiment, a drain-source voltage drop of each of the transistors M1 and M2 can be made to be approximately 0 V during the sampling period.

Therefore, according to the fourth embodiment, similar to the first embodiment, dependency on an input voltage can be eliminated from the gate capacitance of each of the transistors M1 and M2.

Although the present invention has been described above based on each embodiment, the present invention is not limited to the requirement described in the above-described embodiments. The requirement can be changed within a range in which the purpose of the present invention is not adversely affected, and can be appropriately determined according to application form. For example, the source and the drain of the transistors M1 and M2 may be inverted. That is, the drain of each of the transistors M1 and M2 may be connected to the drain of the transistor M4, and the sources of the transistors M1 and M2 may be connected to the other ends of the resistors R1 and R2 respectively.

What is claimed is:

1. A comparator comprising:
a first circuit including a first transistor, a second transistor, and a third transistor, one of the first transistor and the second transistor being an input transistor to which an input analog voltage is applied, and the third transistor being configured to short-circuit a drain and a source of each of the first transistor and the second transistor during a period when the input analog voltage is applied; and
a second circuit configured to output a signal indicating a relationship between magnitude of a first output analog voltage and magnitude of a second output analog voltage, the first output analog voltage and the second output analog voltage being output from the first circuit based on the input analog voltage.

2. The comparator according to claim 1,
wherein the input analog voltage is a first input analog voltage; and
the first circuit is a differential amplifier configured to input the first input analog voltage into a gate of one of the first transistor and the second transistor, and to input a second input analog voltage into a gate of another one of the first transistor and the second transistor.

3. The comparator according to claim 1,
wherein the first circuit is configured to input the input analog voltage into a gate of one of the first transistor and the second transistor, and to input a reference voltage into a gate of another one of the first transistor and the second transistor.

4. The comparator according to claim 1,
wherein the first circuit includes
a first amplifier including the first, second, and third transistors, the first amplifier being configured to output the first output analog voltage and the second output analog voltage; and
a second amplifier provided at a stage subsequent to the first amplifier, the second amplifier being configured to amplify the first output analog voltage and the second output analog voltage, and to output the amplified first output analog voltage and the amplified second output analog voltage to the second circuit.

5. The comparator according to claim 1,
wherein the third transistor is connected between the source of each of the first and second transistors and a power supply;
the third transistor is turned on during the period when the input analog voltage is applied, to set a source voltage of each of the first and second transistors to a voltage of power supply; and
the third transistor is turned off during a period when the input analog voltage is not applied.

6. An analog-to-digital (AD) converter comprising:
a capacitive digital-to-analog (DA) converter including a plurality of capacitors which are binary weighted, one of electrodes of each of the plurality of capacitors being connected to a common node, each of the plurality of capacitors being configured to charge electric charge in accordance with an input analog voltage applied to the common node;

a switch configured to switch between a state in which the input analog voltage is applied to the common node and a state in which the input analog voltage is not applied to the common node;

a control circuit configured to generate a control signal for turning on or off the switch and to supply the control signal to the switch;

a first circuit including a first transistor, a second transistor, and a third transistor, a gate of one of the first transistor and the second transistor being connected to the common node, the third transistor being configured to short-circuit a drain and a source of each of the first transistor and the second transistor during a period when the input analog voltage is applied; and a second circuit configured to output a signal indicating a relationship between magnitude of a first output analog voltage and magnitude of a second output analog voltage, the first output analog voltage and the second output analog voltage being output from the first circuit based on the input analog voltage.

7. The AD converter according to claim 6, wherein
the common node is a first common node,
the AD converter further includes a second common node,
the capacitive DA converter is a first capacitive DA converter,
the plurality of capacitors are a plurality of first capacitors,
the AD converter further includes a second capacitive DA converter including a plurality of second capacitors which are binary weighted, one of electrodes of each of the plurality of second capacitors being connected to the second common node,
the input analog voltage is a first input analog voltage,
the switch is a first switch configured to switch between a state in which the first input analog voltage is applied to the first common node and a state in which the first input analog voltage is not applied to the first common node,
the AD converter further includes a second switch configured to switch between a state in which a second input analog voltage is applied to the second common node and a state in which the second input analog voltage is not applied to the second common node,
the gate of the one of the first transistor and the second transistor is connected to the first common node, and
a gate of another one of the first transistor and the second transistor is connected to the second common node.

8. The AD converter according to claim 6, wherein a reference voltage is applied to a gate of another one of the first transistor and the second transistor.

9. A comparator comprising:
a first circuit including a first transistor, a second transistor, and a third transistor, a source or a drain of each of the first and second transistors being connected to a first node, a gate of one of the first and second transistors being configured to receive an input analog voltage, the third transistor being connected between the first node and a second node of a ground voltage, the third transistor being configured to be turned off during a period when the input analog voltage is applied to the gate of the one of the first and second transistors, and to be turned on during a period when the input analog voltage is not applied to the gate of the one of the first and second transistors; and a second circuit configured to output a signal indicating a relationship between magnitude of a first output analog voltage and magnitude of a second output analog voltage, the first output analog voltage and the second output analog voltage being output from the first circuit based on the input analog voltage.

* * * * *